(12) United States Patent
Noorlag et al.

(10) Patent No.: US 8,299,825 B2
(45) Date of Patent: Oct. 30, 2012

(54) ELECTRONIC AGE DETECTION CIRCUIT

(75) Inventors: Date Jan Willem Noorlag, Fremont, CA (US); Michael Frank, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 378 days.

(21) Appl. No.: 12/610,142

(22) Filed: Oct. 30, 2009

(65) Prior Publication Data

US 2011/0102064 A1 May 5, 2011

(51) Int. Cl.
*H03L 7/00* (2006.01)
(52) U.S. Cl. ......................... 327/142; 327/198
(58) Field of Classification Search .................. 327/142, 327/143, 198
See application file for complete search history.

(56) References Cited

U.S. PATENT DOCUMENTS

| | | | | |
|---|---|---|---|---|
| 4,539,489 A * | 9/1985 | Vaughn | ......................... | 327/206 |
| 4,933,902 A * | 6/1990 | Yamada et al. | .......... | 365/189.08 |
| 5,073,874 A * | 12/1991 | Yamada et al. | ............... | 365/226 |
| 5,321,317 A * | 6/1994 | Pascucci et al. | ............... | 327/143 |
| 6,469,552 B2 * | 10/2002 | Ohbayashi et al. | ............ | 327/143 |
| 6,549,443 B1 * | 4/2003 | Jensen et al. | ..................... | 365/56 |
| 6,552,886 B1 * | 4/2003 | Wu et al. | ......................... | 361/56 |
| 6,566,928 B1 * | 5/2003 | Miyagi | ......................... | 327/217 |
| 6,573,543 B2 * | 6/2003 | Takata | ..................... | 257/295 |
| 6,870,779 B2 * | 3/2005 | Kang | ....................... | 365/189.11 |
| 6,972,602 B2 * | 12/2005 | Akamatsu et al. | ............ | 327/143 |
| 7,081,779 B2 * | 7/2006 | Kang | ............................. | 327/143 |
| 7,085,113 B2 * | 8/2006 | Gauthier et al. | ................ | 361/56 |
| 7,164,300 B2 * | 1/2007 | Hsu | ................................ | 327/198 |
| 7,295,050 B2 * | 11/2007 | Shin et al. | ..................... | 327/143 |
| 7,471,161 B2 | 12/2008 | Liu | | |
| 7,592,876 B2 | 9/2009 | Newman | | |
| 7,652,317 B2 | 1/2010 | Watanabe | | |
| 7,746,131 B2 * | 6/2010 | Chan et al. | ..................... | 327/143 |
| 2001/0045848 A1 * | 11/2001 | Stephens, Jr. | ................ | 327/143 |
| 2006/0055438 A1 * | 3/2006 | Chen et al. | ..................... | 327/143 |
| 2007/0171587 A1 * | 7/2007 | Lee et al. | ........................ | 361/56 |
| 2008/0106308 A1 * | 5/2008 | Tu | ................................. | 327/143 |
| 2009/0160506 A1 * | 6/2009 | Watanabe | ..................... | 327/143 |
| 2011/0095806 A1 * | 4/2011 | Seshita | ......................... | 327/333 |

* cited by examiner

*Primary Examiner* — Lincoln Donovan
*Assistant Examiner* — William Hernandez
(74) *Attorney, Agent, or Firm* — Lawrence J. Merkel; Meyertons, Hood, Kivlin, Kowert & Goetzel, P.C.; Erik A. Heter

(57) ABSTRACT

An aging detection circuit is disclosed. An aging detection circuit may include at least an inverter and a half-latch. During a power-up sequence, if an input voltage of the first inverter changes sufficiently to cause the output of the inverter to change states, the output of the half-latch may be set to a state indicating aging of the circuit. This indication may be used in determining whether or not a supply voltage should be changed to compensate for the aging. A first transistor of the inverter may be arranged such that it remains active subsequent to power-up of the circuit. When active, the first transistor may be subject to degradation mechanisms associated with aging and which change its threshold voltage. The threshold voltage may change such that on a successive power-ups of the circuit, the first transistor is at least momentarily deactivated, leading to the setting of the state indicating aging by the half-latch circuit.

25 Claims, 8 Drawing Sheets

ELECTRONIC AGE DETECTION CIRCUIT

BACKGROUND

1. Field of the Invention

This invention relates to electronic circuits, and more particularly, to circuits for detecting aging in electronic circuits.

2. Description of the Related Art

Over the life an electronic circuit, the effects of aging may have an impact on its operation. Factors such as operating time, voltage, and temperature may change one or more characteristics of various circuit elements. For example, the threshold voltage of a transistor may change over the operating life of an integrated circuit (IC) in which it is implemented. A change in the threshold voltage of one or more transistors may in turn require a change in the supply voltage supplied to the IC. Generally speaking, an increase in the absolute value of a threshold voltage of one or more transistors in an IC may correspond to an increase in the required supply voltage for correct operation.

One common degradation mechanism that manifests itself during the aging of transistors in electronic circuits is negative bias temperature instability (NBTI), which may apply to PMOS (p-channel metal oxide semiconductor) transistors. The affects on a PMOS transistor of NBTI over a period of time may cause an increase in the absolute value of the threshold voltage, along with a decrease in drain current and transconductance. As the absolute value of the transistor's threshold voltage increase over time, a higher supply voltage value is required to ensure that the circuit operates properly. A similar phenomenon, positive bias temperature stability (PBTI) may affect NMOS (n-channel metal oxide semiconductor) transistors. Another potential degradation mechanism is hot carrier injection (HCI), wherein electrons or holes may gain sufficient kinetic energy to overcome barriers between different portions of the silicon (e.g., the barrier between the silicon substrate and the gate dielectric). Higher operating temperatures may exacerbate HCI, as the higher temperatures may be associated with higher amounts of kinetic energy in the electrons/holes. Over time, HCI may degrade the gate dielectric of a transistor, increase its sub-threshold leakage current, and may also shift the threshold voltage.

In order to compensate for the effects of aging, IC's may be operated at a supply voltage that includes a guard band. For example, if the transistors of a given IC require a minimum supply voltage of 900 mV for correct operation, the IC may be operated at 1 V. Thus, as the degradation mechanisms discussed above cause an increase in the minimum required supply voltage, the guard band may provide protection against erroneous operation.

SUMMARY

Various embodiments of a circuit for detecting the aging of electronic circuits are disclosed. In one embodiment, an age detection circuit includes a filter, a pair of inverters coupled in series, and a feedback transistor coupled across a second inverter to form a half-latch circuit. The filter may include an intermediate node coupled to an input of a first inverter. When power is initially applied to the circuit, a voltage on the input of the first inverter may rise to a peak, and then fall again to approximately a ground voltage. If the voltage on the input of the first inverter rises sufficiently to toggle its output state, the state of the output of the second inverter may also change. This in turn may cause the activation of the feedback transistor, which may then drive the node coupled to the output of the first inverter, regardless of its input state.

In one embodiment, a first inverter includes a first PMOS (p-channel metal oxide semiconductor) transistor and a first NMOS (n-channel metal oxide semiconductor) transistor. The first PMOS transistor is configured to, when active, provide a pull up path between the output node of the first inverter and a supply voltage node. A half-latch circuit formed by a second inverter and a feedback transistor includes a second PMOS transistor and second and third NMOS transistors. The third NMOS transistor includes a gate terminal coupled to the output of the second inverter, a drain terminal coupled to the output of the first inverter, and a source terminal coupled to the output of a ground terminal. When the third NMOS transistor is active, a pull down path is provided between the output of the first inverter and the ground node. The first PMOS and third NMOS transistors are sized relative to each other such that the third NMOS transistor may overdrive the first PMOS transistor. Accordingly, when the first PMOS and third NMOS transistors are active at the same time, the output of the first inverter may be pulled down toward the voltage on the ground node, as the drive strength of the third NMOS transistor may exceed that of the first PMOS transistor. Accordingly, the output of the first inverter may be held to a logic 0 even if its input is also a logic 0.

Various embodiments of the arrangement described above may allow the circuit to be used to provide an indication of aging. Due to the arrangement of the first inverter, the first PMOS transistor may remain active, when power is applied, subsequent to the initial application of power to the circuit. Since the first PMOS transistor may remain active subsequent to the initial power up of the circuit, it may thus be subject to degradation mechanisms that change its threshold voltage as it ages. Thus, during a subsequent power up sequence, the rise of the voltage on the input of the first inverter may cause the first PMOS to turn off, at least momentarily, and thus cause the output of the first inverter to change states. This momentary change of states may in turn cause the output of the second inverter to change states, thereby activating the third NMOS transistor (e.g., the feedback transistor). Activation of the third NMOS transistor may hold the output of the first inverter (and thus, the input of the second inverter) to a first state, and thus the output of the second inverter to a second state. This second state may indicate a certain amount of aging. This indication may be used along with one or more indications of aging provided by other age detection circuits to determine whether or not the supply voltage should be increased to compensate for the aging of the IC in which they are implemented.

BRIEF DESCRIPTION OF THE DRAWINGS

The following detailed description makes reference to the accompanying drawings, which are now briefly described.

Figure 1:
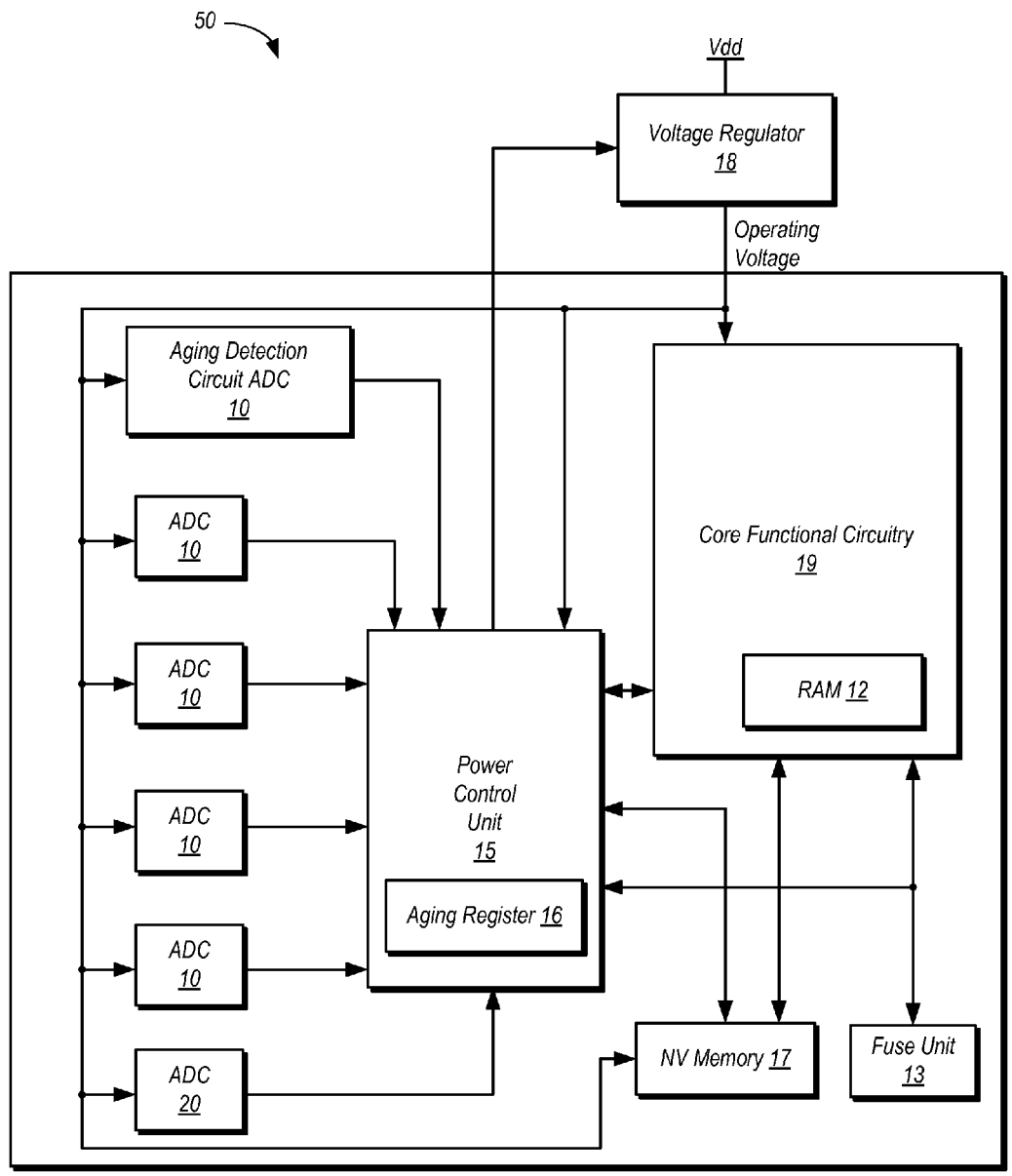
FIG. 1 is a block diagram of one embodiment of an integrated circuit (IC) having an age compensation apparatus.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit:

Turning now to FIG. 1, a block diagram of one embodiment of an integrated circuit (IC) 50 is illustrated. In the embodiment shown, IC 50 includes a plurality of aging detection circuits (ADC's) 10 and 20, a power control unit 15, a non-volatile (NV) memory 17, and core functional circuitry 19. The core functional circuitry may be that circuitry that is configured to perform the intended functions of IC 50. IC 50 may also be coupled to, or may include, a voltage regulator 18 coupled to receive a supply voltage and configured to provide an operating voltage. Voltage regulator 18 may be a variable voltage regulator, in which the operating voltage provided thereby may be adjusted.

IC 50 may be one of a number of different types of integrated circuits. For example, IC 50 may be a system on a chip (SOC), incorporating a number of different functions, including processing functions, memory, I/O functions, and other types of functions associated with SOC's. In another embodiment, IC 50 may be a discrete processor, or other discrete component IC such as a bridge, an I/O component, etc. used in a computer system (e.g., in a desktop or laptop computer). IC 50 may also be an application specific integrated circuit (ASIC). Generally speaking IC 50 may be any type of IC, and may include analog and/or digital circuitry.

As previously noted, IC 50 includes a plurality of aging detection circuits (ADC's) 10 and at least one ADC 20, which may be a variation of ADC 10. The ADC's 10 and 20 may be various types of circuits used to detect aging of IC 50. In some embodiments, each ADC 10 may be a ring oscillator, or a counter. Aging may be detected via variations in the frequency of the ring oscillator over time, for example. Embodiments wherein each of ADC's 10 is the same or similar type of circuit to ADC 20 are also possible and contemplated. Further embodiments are also possible and contemplated wherein a variety of different types of circuits are used to detect aging are implemented. Embodiments of ADC 20 will be discussed in further detail below.

Each ADC 10 and ADC 20 in the embodiment shown is coupled to power control unit 15. Power control unit 15 may perform various power control functions, including adjustment of the supply voltage based on aging of IC 50. In the embodiment shown, each ADC 10 and 20 may provide respective indications of aging to an aging register 16 of power control unit 15. Aging register 16 may store the indications of aging in order to enable power control unit 15 to make a determination of the aging of IC 50. For example, each ADC 10 and 20 may be configured to provide a bit in a first state to indicate aging of that particular ADC 10/20 up to or beyond a certain threshold, and to provide a bit in a second (complementary) state to indicate that the ADC 10/20 has not aged up to the threshold. However, in other embodiments, particular ones of ADC 10 may provide other indications of aging to power control unit 15 (e.g., a count value, a frequency, etc.), which may then be converted into information storable in aging register 16.

Power control unit 15 in the embodiment shown is configured to determine the aging of IC 50 based on the indications stored in aging register 16. In some embodiments, each individual ADC 10/20 may be configured to provide indications of aging up to a threshold value different from other instances of ADC 10/20. For example, a first ADC 10 may provide an indication responsive to aging sufficiently to cross a first threshold, while a second ADC 10 may provide an indication responsive to aging sufficiently to cross a second threshold, wherein the aging associated with the second threshold is greater (e.g., more elapsed time) than the first threshold. Thus, based on reading the indications of aging stored in aging register 16, power control unit 15 may determine the aging of IC 50 (e.g., the approximate amount of operating time elapsed for IC 50, or the approximate amount of degradation that has occurred due to aging). In other embodiments, there may be no aging register 16. The power control unit 15 may directly operate on the inputs from the ADCs 10 and 20, for example.

Responsive to determining the aging of IC 50, power control unit 15 may compare a desired operating voltage for that level of aging to a current operating voltage. If the desired operating voltage and the current operating voltage are the same, power control unit 15 may refrain from performing any additional action. However, if the desired operating voltage is different from the current operating voltage, power control unit 15 may perform actions to cause IC 50 to subsequently change the operating voltage. For example, power control unit 15 may, responsive to determining that the desired and current operating voltages are different, write information to NV memory 17 indicative of the new (i.e. desired) operating voltage. During a subsequent boot-up of a system in which IC 50 is included, the NV memory 17 may be queried, and the operating voltage may be set based on the indicated value stored therein. In addition, power control unit 15 may be configured to provide signals to voltage regulator 18 to effect a change in the operating voltage provided to IC 50.

In the embodiment shown, IC 50 also includes a fuse unit 13. During an initial powering on of IC 50 (i.e. the very first time it is powered up), power control unit 15 may read information from fuse unit 13 to determine the initial operating voltage. This value may then be written into NV memory 17, and may also be used to set the initial operating voltage by providing signals indicating the same to voltage regulator 18. During subsequent start-ups of IC 50, the operating voltage value may be obtained by reading NV memory 17 or by determining the desired operating voltage based on aging as described above.

Increasing the operating voltage over the life of IC 50 may compensate for aging effects to which IC 50 may be subject. For example, various transistors may degrade over the life of IC 50, which may cause an increase in the magnitude of their respective threshold voltages. The increasing magnitude of one or more threshold voltages may necessitate operating IC 50 at a higher operating voltage, which may be put into effect as described above and elsewhere herein.

In addition to compensating for aging, the various embodiments of a method and apparatus described herein, including the above, may allow for lower initial operating voltages (i.e. the operating voltage at the beginning of life of IC 50). Since IC 50 is configured to compensate for aging having its operating voltage raised over time, the initial operating voltage may be specified without the need for a significant guard band to protect against the effects of aging. This may allow for a lower initial operating voltage than would otherwise be possible if a significant guard band was required. This lower initial operating voltage may in turn lead to a lower power consumption during the early life of the circuit. The lower initial operating voltage may also reduce the aging of the circuit, since many aging mechanisms are proportional to supply voltage magnitude, accelerating with higher voltages.

It should be noted that embodiments are possible and contemplated wherein some or all of the functions performed by power control 15 are performed by software instead of hardware. For example, software instructions may be executed to determine the aging of IC 50 based in the indications of aging provide by the ADC's 10/20, to write information indicative of a specified operating voltage value to NV memory 17, and to cause signals to be provided to voltage regulator 18 in order to set the operating voltage to that specified in NV memory 17. Software instructions may also be executed to designate a portion of a memory to store the indications of aging, in lieu of providing aging register 16 (e.g. within RAM 12 of core functional circuitry 19 in the illustrated embodiment).

It is noted that the ADCs 10 and 20 are illustrated for convenience in the block diagram of FIG. 1 as separate from the area occupied by other circuitry. However, in one embodiment, the ADCs 10 and 20 may be physically distributed over the surface of the integrated circuit 50 (including the areas occupied by the core functional circuitry 19, the power control unit 15, etc.).

Figure 2:
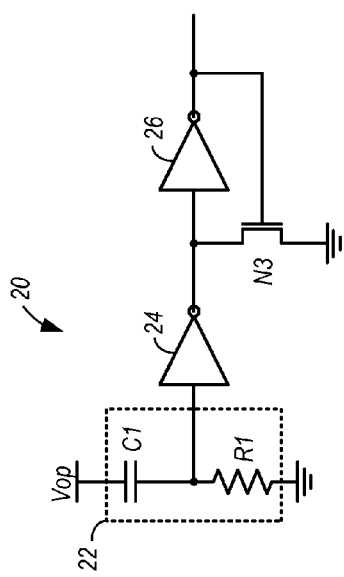
FIG. 2 is a logic diagram of one embodiment of an aging detection circuit.

Aging Detection Circuit and Operation:

FIG. 2 is a logic diagram of one embodiment of ADC 20. In the embodiment shown, ADC 20 includes a filter 22, first inverter 24, second inverter 26, and feedback transistor N3. Filter 22 in the embodiment shown is a high pass filter including capacitor C1 and resistor R1, although other types of filters (e.g., low pass or band pass) may be used as well. In some embodiments, filter 22 may be replaced by other circuitry, including circuitry that may mimic its behavior. Embodiments utilizing digital filters are also possible and contemplated. Furthermore, filter 22 may be replaced in some embodiments by an up/down counter coupled to a digital-to-analog converter (DAC) to generate the input voltage at the input of first inverter 22. In general, any suitable type of circuitry for generating a momentary input voltage on the input of inverter 24 may be used in various embodiments of ADC 20.

Figure 4:
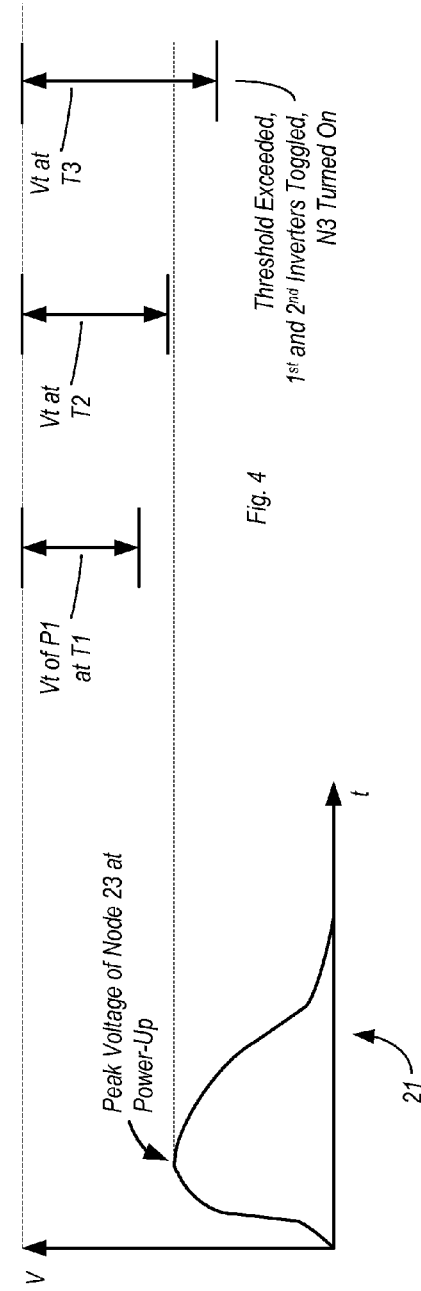
FIG. 4 is a graphic illustrating the functioning of one embodiment of an aging detection circuit over time.

In the embodiment shown, filter 22 is configured such that when power is initially applied to node Vop (the operating voltage node), the voltage on the input of inverter 24 rises and then falls in a manner comparable shown in graph 21 of FIG. 4. This voltage may or may not rise to a level sufficient to change the output of inverter 24. The output of inverter 24 may be provided to the input of inverter 26. The output of inverter 26 may be provided to transistor N3, and may also be provided to other units, such as power control unit 15 as shown in FIG. 1. Inverter 26 and transistor N3 are arranged to form a half-latch circuit in the embodiment shown, wherein a change of the input/output state of inverter 26 to a logic one (high voltage) may be held via activation of transistor N3.

The state of the output of inverter 24 may depend both on the state of its input, as well as on the state of transistor N3. In the embodiment shown, if the input of inverter 24 is a logic 0 (e.g., a low voltage), then its output will be a logic 1 if transistor N3 is inactive. The logic 1 on the output from inverter 24 may be input into inverter 26, causing the output of inverter 26 to output a logic 0. The logic 0 (which is a low voltage in this example) may in turn cause transistor N3 to remain inactive. Furthermore, a logic 0 output by inverter 26 may indicate that ADC 20 has not detected aging up to at least a certain aging threshold. A logic 1 output by inverter 26 may indicate that ADC 20 has detected aging up to or beyond that threshold.

If the voltage on the input of inverter 24 rises sufficiently during the initial power up sequence (e.g. to the toggle point, or trip point, of the inverter), the output of inverter 24 may change states from a logic 1 to a logic 0. If the output of inverter 24 (and thus the input of inverter 26) changes to a logic 0, inverter 26 may respond by outputting a logic 1. The outputting of the logic 1 by inverter 26 may result in a gate voltage sufficient to turn on transistor N3. When transistor N3 is activated, a pull-down path may exist between the output node of inverter 24 and ground. Accordingly, the output of inverter 24 may be pulled down toward ground (and thus toward a logic 0), irrespective of the logic value on its input. The logic 0 on the output of inverter 24 may cause the output of inverter 26 to be a logic 1, thereby causing transistor N3 to remain active. Accordingly, the half-latch circuit formed by inverter 26 and transistor N3 in the embodiment of FIG. 2 is arranged such that once transistor N3 is active, the input and output states of inverter 26 may be held to the same values for the remainder of time that power is applied to ADC 20. As a result, even if the input of inverter 24 falls to a logic 0, the logic 0 output state of inverter 24 may be enforced by the activation of transistor N3.

Figure 3:
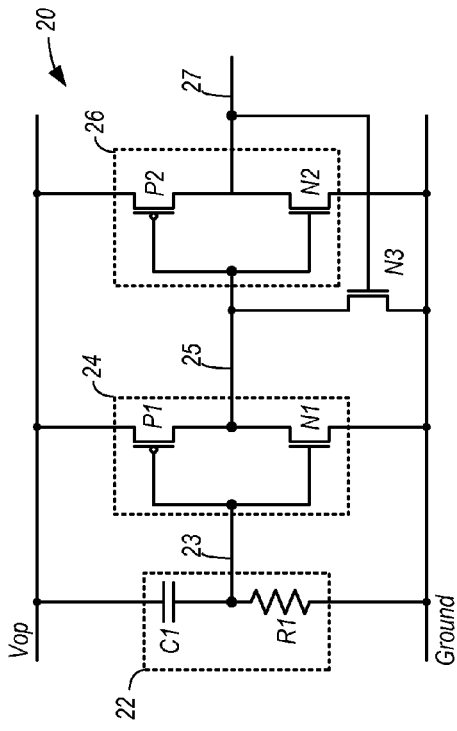
FIG. 3 is schematic diagram of one embodiment of an aging detection circuit.

FIG. 3 is schematic diagram that further illustrates an embodiment of ADC 20. In the embodiment shown, first inverter 24 includes a PMOS (p-channel metal oxide semiconductor) transistor P1 and an NMOS (n-channel metal oxide semiconductor) transistor N1. Transistor P1 in this embodiment includes a source terminal coupled to Vop, a drain terminal coupled to node 25, and a gate terminal coupled to node 23. Transistor N1 in this embodiment includes a drain terminal coupled to node 25, a source terminal coupled to ground, an a gate terminal coupled to node 23.

Inverter 26 in the embodiment shown includes PMOS transistor P2 and NMOS transistor N2. Transistor P2 in this embodiment includes drain and source terminals coupled to node 27 and Vop, respectively, and a gate terminal coupled to node 25. Transistor N2 in this embodiment includes drain and source terminal coupled to node 27 and ground, respectively, and a gate terminal coupled to node 25. As with the embodiment of FIG. 2, a half-latch circuit is formed by inverter 26 and transistor N3. Transistor N3 in this embodiment includes gate, drain, and source terminals coupled to node 27, node 25, and ground, respectively. ADC 20 as shown in FIG. 3 also includes capacitor C1 and resistor R1 (coupled together at node 23), although as previously noted, other filter embodiments are possible and contemplated.

When a voltage equivalent to a logic 0 is provided to node 23 (i.e. the input node of inverter 24) in the embodiment shown, transistor P1 may be active while transistor N1 may be inactive. Accordingly, transistor P1 may remain active for nearly the entire time power is applied to ADC 20. When power is initially applied to ADC 20, a low voltage is present on the input of inverter 24, and thus transistor P1 may activate. If the initial voltage bump illustrated in graph 21 of FIG. 4 does not rise to a level sufficient to turn off transistor P1, it may thus remain active for the remainder of time that power is applied to ADC 20. Accordingly, transistor P1 may be subject to degradation mechanisms that occur with the aging of a PMOS transistor. In this particular example, transistor P1 may be subject to at least the degradation mechanism of negative bias temperature instability (NBTI). NBTI may cause the magnitude of the threshold voltage to increase over time, and this may affect whether or not P1 is turned off, at least momentarily, during a subsequent power on sequence.

When transistor P1 is on, a pull-up path between node 25 and Vop may be provided. If transistor N1 is turned off while P1 is on, then node 25 may be pulled up toward Vop. This may result in a logic 1 voltage present on node 25. As a result of the logic 1 voltage on node 25, transistor N2 of inverter 26 may be active, while transistor P2 may remain inactive. When active, transistor N2 may provide a pull-down path between node 27 and ground, thereby causing a logic 0 voltage to be present on that node. The logic 0 voltage present on node 27 may be insufficiently high to activate transistor N3.

If, during a power up sequence, the voltage present on node 23 rises sufficiently high, transistor P1 may be momentarily deactivated. Transistor N1 may become active, thereby providing a pull-down path between node 25 and ground. Accordingly, inverter 24 will have changed its input/output states, at least momentarily, as a logic 0 voltage may be present on node 25. As a result of the logic 0 voltage on node 25, transistor N2 may be deactivated, while transistor P2 may become active. The activation of transistor P2 may result in a pull-up path between node 27 and Vop, while the deactivation of transistor N2 may block the pull-down path between node 27 and ground. Accordingly, node 27 may be pulled up toward the operating voltage present on Vop, which results in a logic 1 voltage being driven by inverter 26. The logic 1 voltage may further be sufficient to cause the activation of transistor N3. The activation of transistor N3 may then create a pull-down path between node 25 and ground. This may effectively force a logic 0 voltage onto node 25, and thereby force a logic 1 voltage onto node 27. The logic 0 on node 25 and logic 1 on node 27 may be held for the remainder of time that power is provided to ADC 20.

After the voltage on node 23 falls again, transistor N1 may be deactivated, while transistor P1 may be activated again if not previously deactivated. However, if N3 is active, it may continue to drive a low voltage (and thus a logic 0) onto node 25, regardless of the state of transistor P1. In various embodiments, transistors N3 and P1 are sized relative to each other such that N3 has more drive strength than P1. In one example, the respective channel width/length ratios of N3 and P1 are sized such that N3 is at least twice as large as P1. Accordingly, when both N3 and P1 are active, node 25 may be driven to a low voltage, even though P1 is active, since the drive strength of transistor N3 is sufficient to overdrive that of transistor P1. Furthermore, when both N3 and P1 are active, a situation may exist wherein a logic 0 is present both on the input and output of inverter 24.

It should be noted that the circuits illustrated in FIGS. 2 and 3 are exemplary, and thus other embodiments are possible and contemplated. For example, circuit may be implemented using different types of transistors and different logic levels, while still falling within the general scope of the particular circuit embodiments discussed herein.

FIG. 4 is a graph illustrating an example of the operation for one embodiment of ADC 20 with respect to aging. As previously noted, graph 21 illustrates an approximation of the voltage present on node 23 during the initial application of power to ADC 20. When power is initially applied to ADC 20, the voltage on node 23 may rise up to a peak value, and may then subsequently fall, the duration of this rise and fall may be short in duration, but may be long enough to turn off transistor P1 depending on its threshold voltage. At time T1 during the life of the circuit (e.g., at the beginning of its operating life), the magnitude of the threshold voltage of transistor P1 is small enough that the voltage rise on node 23 is not sufficient to change its state from active to inactive. At time T2, later during the life of the ADC 20, the magnitude of the threshold voltage of P1 has increased due to degradation mechanisms incurred during its operation. However, at time T2, the magnitude of the threshold voltage has not increase enough to cause transistor P1 to deactivate during the power on sequence. However, at time T3 during the life of ADC 20, the magnitude of the threshold voltage has increased enough that the peak voltage on node 23 is sufficient to cause at least a momentary deactivation of transistor P1. The momentary deactivation may be accompanied by a momentary activation of transistor N1, thereby resulting in a logic 0 on node 25, a logic 1 on node 27, the activation of transistor N3, and the holding of node 25 to a logic 0 even after the voltage on node 23 falls enough to allow P1 to become active again.

Figure 5:
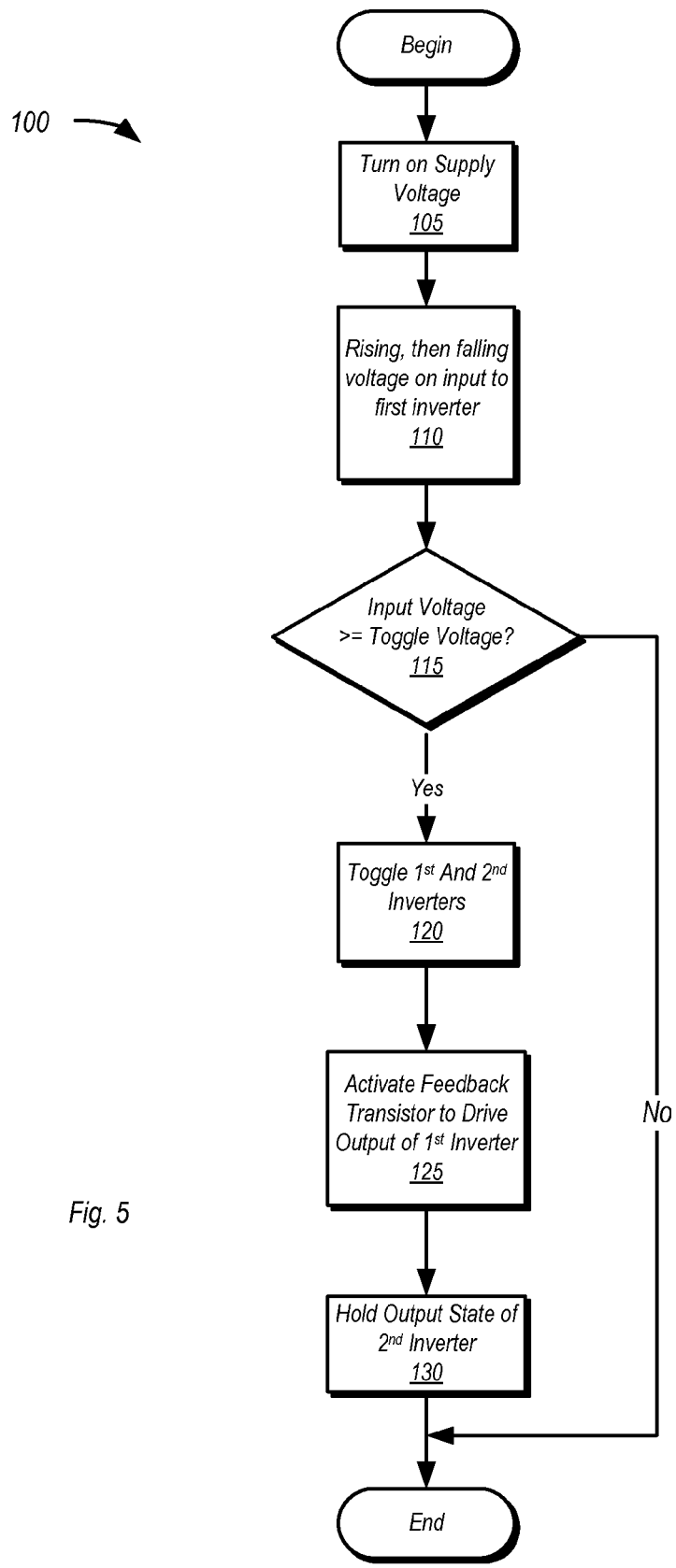
FIG. 5 is a flow diagram of one embodiment of a method for operating an aging circuit.

Turning now to FIG. 5, a flow diagram of one embodiment of a method for operating an aging circuit is shown. The operation of the circuit illustrated by FIG. 5 may apply to the circuit embodiments discussed with reference to FIGS. 2 and 3, although the illustrated method may apply to other embodiments as well. In the embodiment shown, method 100 begins with the turning on of a supply voltage (block 105). Responsive to the turning on of the supply voltage, the voltage on the input of a first inverter (e.g., on node 23 of FIG. 3) may rise and then subsequently fall (block 110), in a manner similar to that shown in graph 21 of FIG. 4.

In some cases, particularly when the circuit has not aged a certain amount, the voltage on the input of the first inverter may not rise to a level sufficient to toggle that inverter (block 115, no), and thus the output state of both inverters may remain unchanged. If, during this portion of the power-on sequence, the voltage on the input of the first inverter rises enough to change states (block 115, yes), both the first and second inverters may be toggled (i.e., their respective output states may be changed; block 120). For example, the output of the first inverter may fall to a logic 0, while the output of the second inverter may rise to a logic 1. This may lead to the activation of a feedback transistor (block 125), such as transistor N3 as shown in FIGS. 2 and 3. The activation of the feedback transistor may cause the output state of the $2^{nd}$ inverter to be held until power is no longer applied to the circuit (block 130). This may be accomplished by the feedback transistor driving the state of the input of the second inverter, which may include overdriving a state that the first inverter attempts to drive. For example, as the voltage on the input of the first inverter falls back toward ground, a PMOS transistor (e.g., P1 of FIG. 3) may re-activate and attempt to drive its output to a logic 1. However, the feedback transistor may be configured to have sufficient drive strength to overdrive the PMOS transistor of the first inverter, thus driving the output of the first inverter (and input of the second inverter) to a logic 0. It should be noted however, that the exemplary PMOS transistor discussed herein may remain active even if the feedback transistor is driving the first inverter output low.

Figure 6:
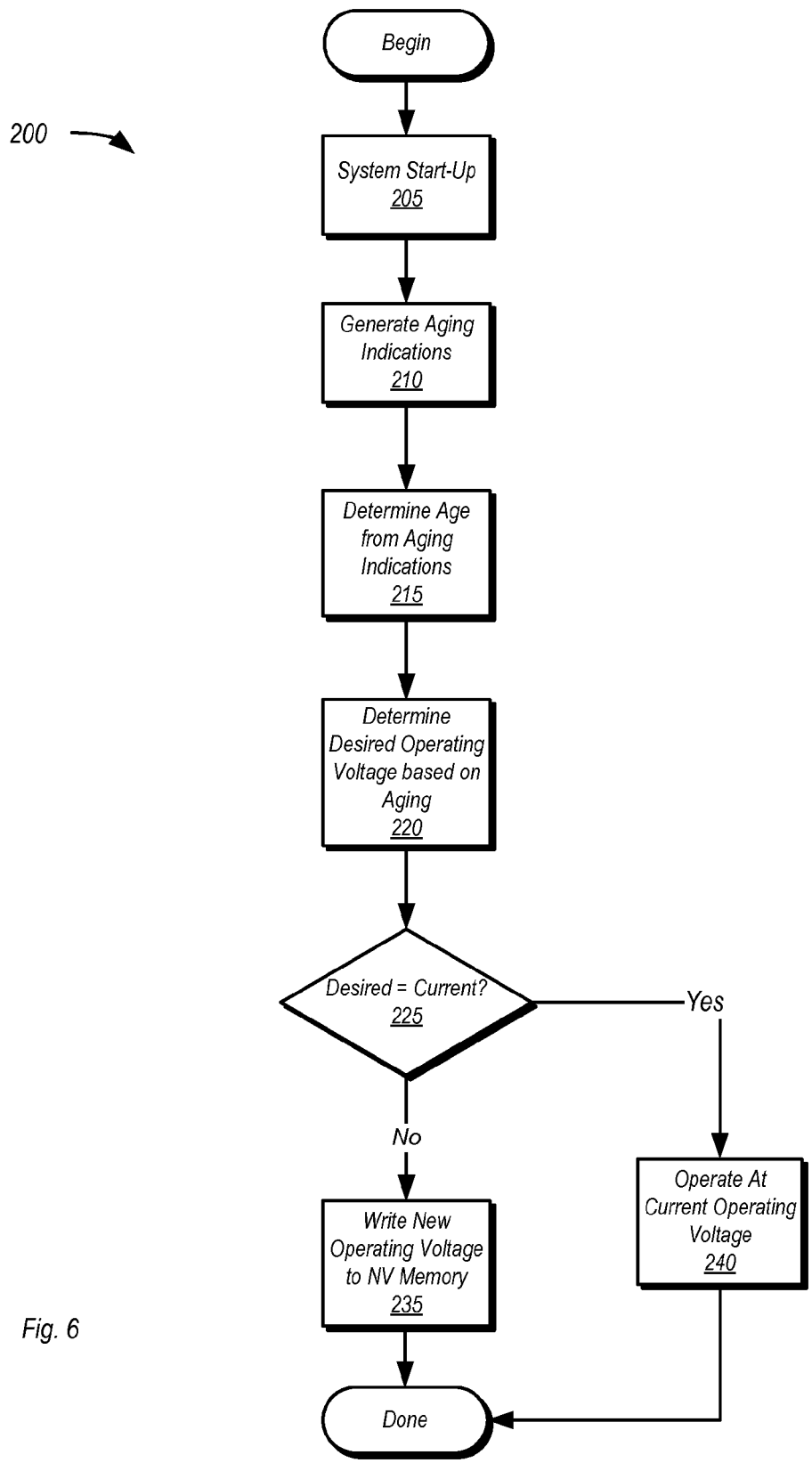
FIG. 6 is a flow diagram of one embodiment of a method for determining an operating voltage for an IC.

Age Compensation Methodology:

FIG. 6 is a flow diagram of one embodiment of a method for determining an operating voltage for an IC. More particularly, FIG. 6 illustrates one embodiment of a method for adjusting an operating voltage of an IC to compensate for the effects of aging.

In the embodiment shown, method 200 begins with a system start-up routine being executed (block 205). The system start-up routine may include the application of power to the IC, as well as the performing of other functions. Responsive to applying power to the IC, one or more aging indications may be generated (block 210). Various types of circuits may be used to generate the aging indications, including those discussed above with reference to FIGS. 1-5. The indications of aging may indicate that a particular circuit has or has not shown effects of aging. For example, if an ADC 20 as discussed above provides a logic 0, it may indicate that it has not undergone a certain amount of aging, while a logic 1 provided by the same circuit may indicate that it has undergone a certain amount of aging.

After the indications of aging have been generated, the aging of the IC may be determined (block 215). The aging may be determined by taking an aggregate of the one or more aging indications. For example, consider an embodiment having ten instances of ADC 20 discussed in FIGS. 2 and 3. Transistors in these circuits may be sized such that different magnitudes of threshold voltage shift cause detection of aging by each circuit. That is, for example, a threshold voltage shift of 10 millivolts may be detected by one aging circuit, a threshold voltage shift of 20 millivolts may be detected by another aging circuit, etc. Accordingly, the number of instances of the aging detection circuit that detect aging may be an indication of the aging effects that have occurred. For example, if three of the ten instances are providing logic 1's, while the remaining seven are providing logic 0's, then approximately 30% of the detectable aging may have been detected. The more logic 1's that are detected from the ADCs 10 and 20, the greater the estimated aging effects are. Other embodiments may signal aging with a logic 0 rather than logic 1, if desired.

Once the aging of the IC has been determined, a desired operating voltage may also be determined (block 220). In various embodiments, different operating voltages may be associated with different levels of aging. For example, a first operating voltage may be associated with the beginning of operational life of the IC, a second operating voltage may be associated with a time after which one aging indication has been asserted, a third operating voltage may be associated with a time after two aging indications have been asserted, and so forth. Each successive operating voltage may be greater than the previous one, as the operating voltage may be increased to compensate for the aging of the IC and thus the circuitry therein. Thus, as the IC ages over its operational life, its operating voltage may be increased. The operating voltages to be provided in response to various levels of detected aging may be supplied to the IC 50 in any desired fashion. For example, a table may be accessible to the power control unit 15. A hardware table, programmable via software or fuses, may be provided. Alternatively, a software managed table stored in memory may be used. The operating voltage magnitudes for each detected age may be stored, or deltas to be added to an original voltage magnitude (e.g. from the fuse unit 13) may be stored, in various embodiments.

If the desired operating voltage is determined to be equivalent to the current operating voltage (block 225, yes), then the IC may continue operation at that particular voltage (block 240). However, if the desired operating voltage is not equivalent to the current operating voltage (block 225, no), then information indicative of the desired operating voltage may be written to a non-volatile (NV) memory (block 235). During a subsequent start-up (i.e. boot sequence) of the system, the NV memory may be queried for the information indicative of the stored voltage value, and the operating voltage for the IC may be set to this value. In some embodiments, block 235 may also involve changing the operating voltage of the IC at the time the determination is made, instead of waiting for a subsequent system start-up cycle to make such a change.

Figure 7:
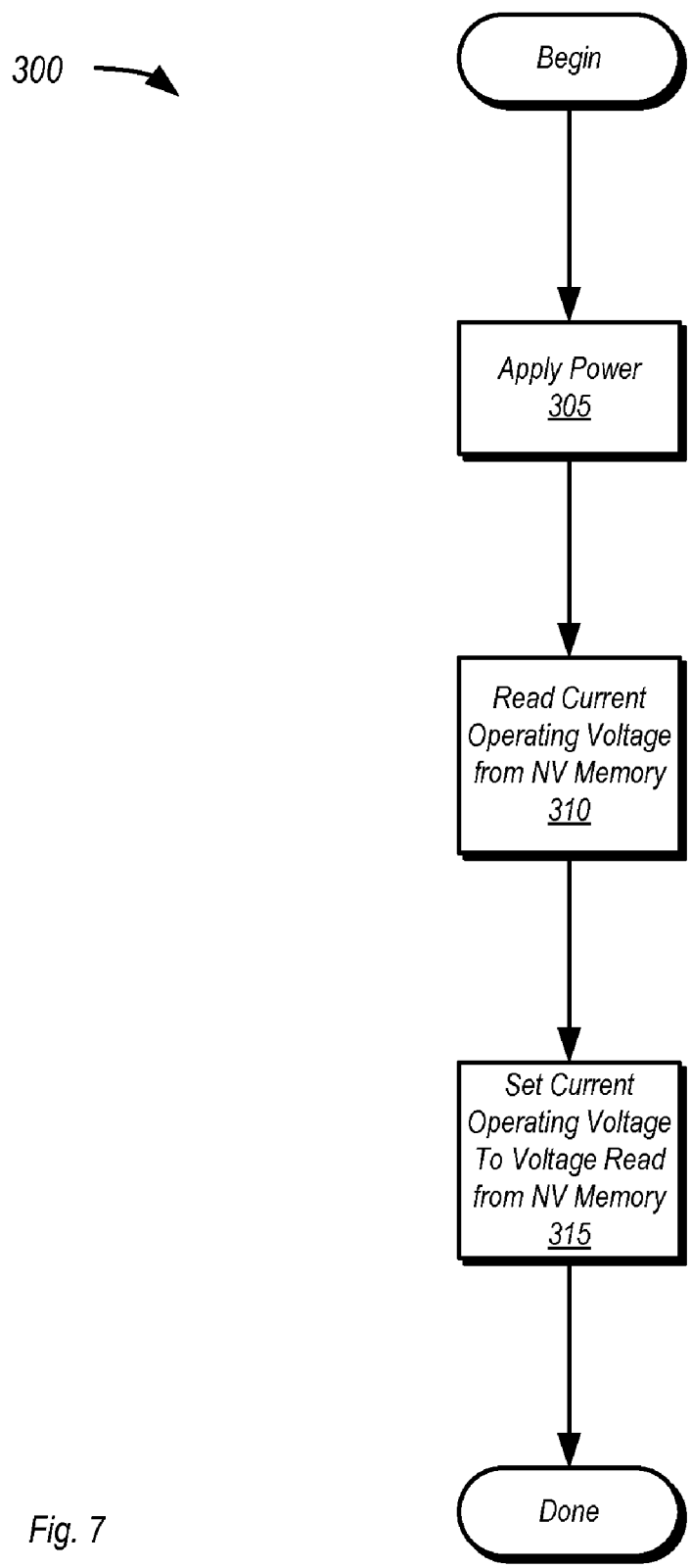
FIG. 7 is a flow diagram of one embodiment of a start-up sequence of an IC.

FIG. 7 is a flow diagram of one embodiment of a start-up sequence of an IC. The start up sequence illustrated in FIG. 7 may be one that occurs subsequent to an initial start-up of the IC. For example, method 300 may be applied to a start-up of an IC implemented in a system that has been used on previous occasions.

In the embodiment shown, method 300 begins with the application of power to the system (block 305). The application of power may initiate a boot-up sequence that may include determining an operating voltage for the IC. During the boot-up sequence, an operating voltage for the IC may be determined by reading information indicative thereof from an NV memory (block 310). The information indicating the operating voltage value in the NV memory may have been written during a previous cycle of operation. The indicated voltage may be an initial operating voltage, determined from reading fuses during an initial start-up of the IC, or may be an operating voltage determined based on a determination of aging of the IC. After the information has been read, the operating voltage of the IC may be set to the indicated voltage (block 315).

Figure 8:
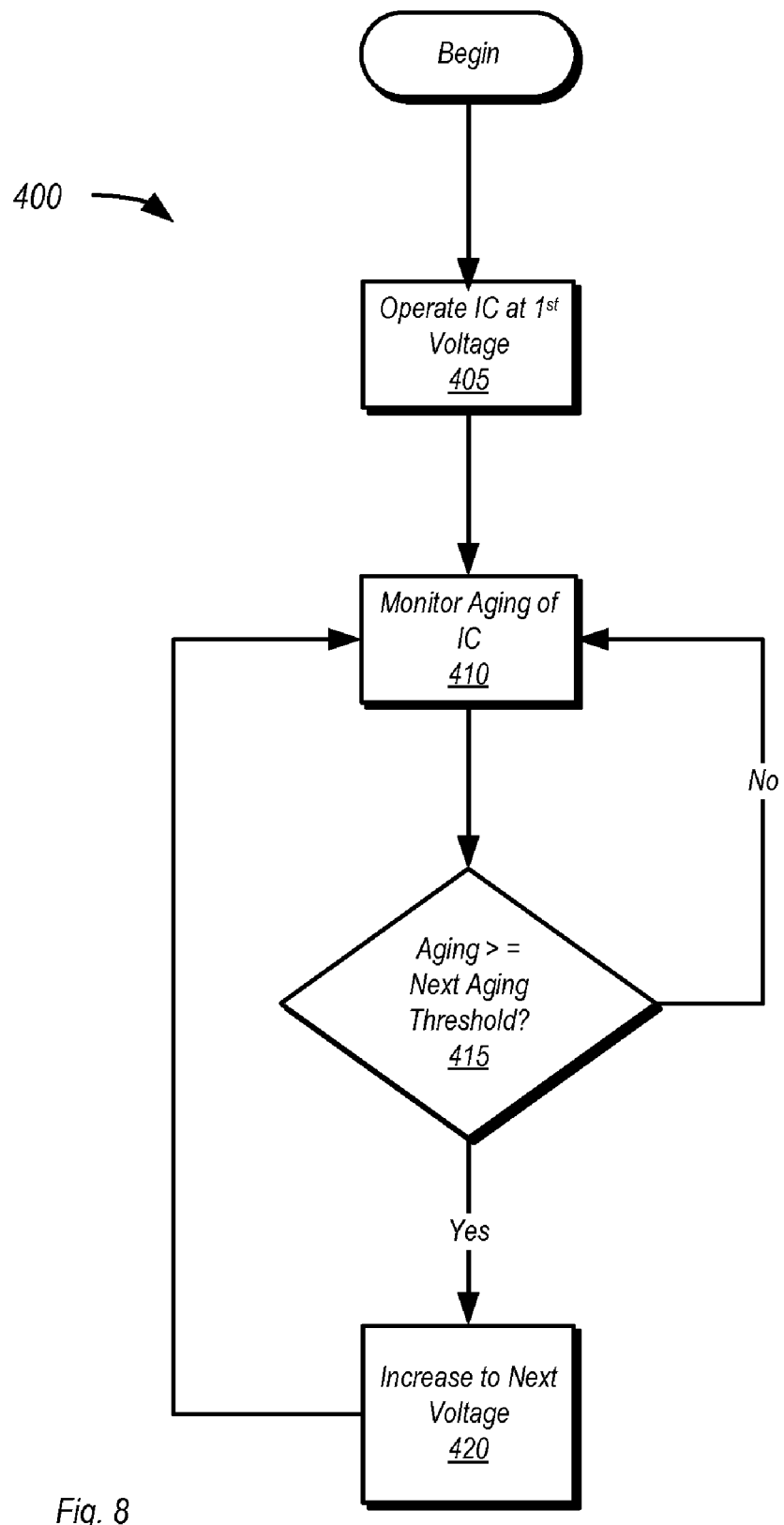
FIG. 8 is a flow diagram of one embodiment of a method for compensating for aging effects of the life of an IC.

FIG. 8 is a flow diagram of one embodiment of a method for compensating for aging effects of the life of an IC. In the embodiment shown, method 400 includes operating an IC at a first operating voltage (block 405). The first operating voltage may be the initial operating voltage at which the IC is operated, i.e. its beginning-of-life operating voltage. This voltage may be determined with a minimal guard band, since the method described herein may compensate for the aging of the IC over its life by raising the operating voltage as necessary. The first voltage referred to in block 405 may also be a subsequent operating voltage that is greater than the initial operating voltage.

Method 400 further includes monitoring the aging of the IC (block 410). Aging of the IC may be monitored using the various methods and mechanisms discussed above, including the use of the various ADC's 10/20 described in reference to FIG. 1. For example during each start-up of the IC subsequent to an initial start-up, indications of again may be checked to determine if aging has occurred and has made a higher operating voltage desirable. Any aging determined may be compared to an aging threshold, and if it is determined that aging has occurred up to or beyond a next aging threshold (415, yes), then the operating voltage of the IC may be increased. The increase of the operating voltage may compensate for the aging of the circuitry within the IC. If the aging is less than the next aging threshold (415, no), then the IC may continue operating at the current operating voltage while monitoring continues (block 410).

The method described above may be repeated for a number of different aging thresholds, and may thus implement a corresponding number of operating voltages. As the aging thresholds are successively met and exceeded over the life of the IC, the operating voltages may also be successively increased in order to compensate for the aging of the IC.

Figure 9:
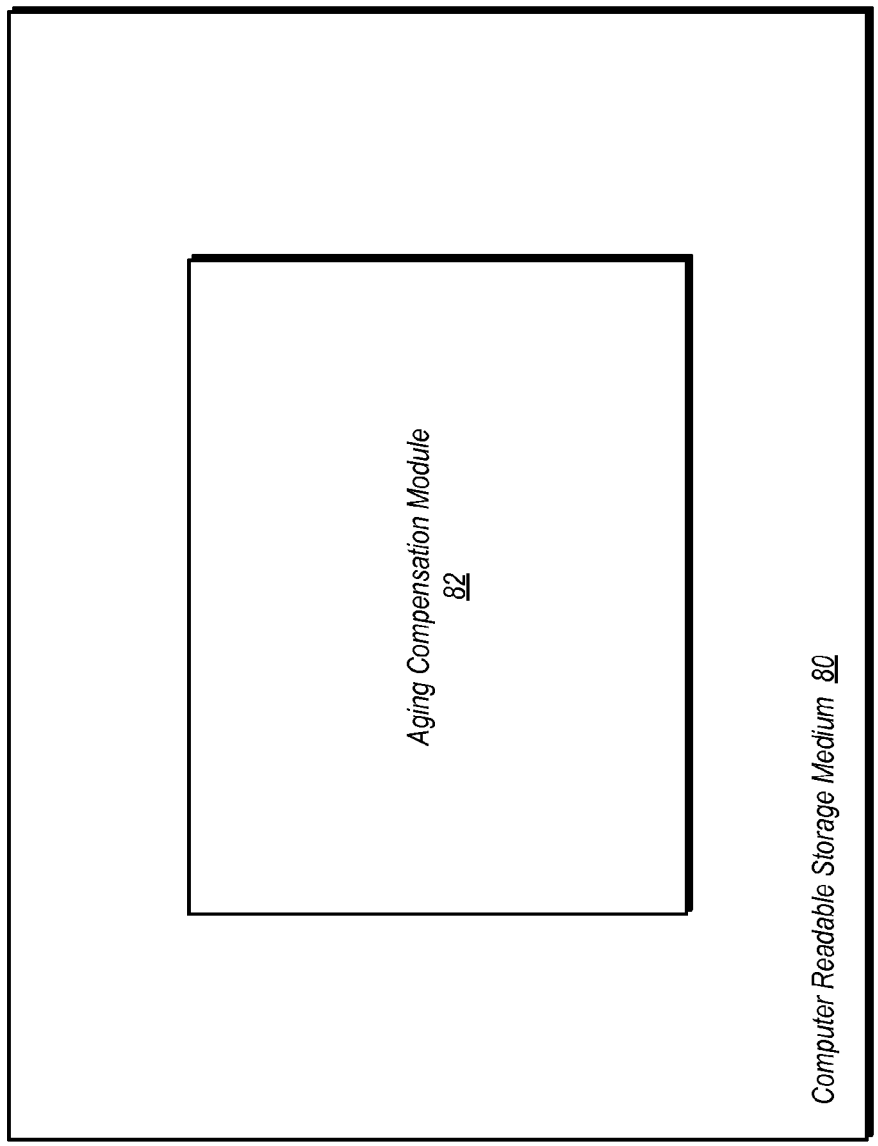
FIG. 9 is a block diagram of one embodiment of a computer readable storage medium storing instructions for implementing age compensation in an IC.

Computer Readable Medium for Software Implementation:

FIG. 9 is a block diagram of one embodiment of a computer readable storage medium storing instructions for implementing age compensation in an IC. In the embodiment shown, computer readable storage medium 80 stores various digital information, including instructions and data to implement aging compensation module 82. In various embodiments, the instructions and data of aging compensation module 82 may implement portions of the aging compensation methods described above. The aging compensation module may be the power control unit 15 illustrated in FIG. 1. For example, aging compensation module 82 may include instructions that may be executed on a computer system to read (e.g., from a register) indications of aging, and to determine the aging based on the indications and a corresponding desired operating voltage. Instructions of aging compensation module may also be executable to compare the desired operating voltage to a present operating voltage, and to cause information indicating an updated operating voltage to be written into a non-volatile memory. The instructions may also be executable to change the operating voltage of the IC during its operation, prior to the next start-up sequence. In addition, instructions stored in aging compensation module may cause the non-volatile memory to be read during a subsequent start-up sequence to determine the voltage at which the IC is to be operated.

Some instructions may be exclusive to a first time (i.e. initial) start-up of the IC. For example, instructions may be included that cause the reading of fuses to determine an initial, beginning-of-life operating voltage for the IC, which may be executed in conjunction with instructions to write this voltage to the non-volatile memory.

Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW or Blu-Ray. Storage media may further include volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link. The computer accessible storage medium 50 in FIG. 9 may store the aging compensation module 82, which may implement one or more of the flowcharts shown in FIGS. 5, 6, 7, and 8 (or portions thereof). Generally, the computer accessible storage medium 200 may store any set of instructions which, when executed, implement a portion or all of the flowcharts shown in FIGS. 5, 6, 7, and 8. A carrier medium may include computer accessible storage media as well as transmission media such as wired or wireless transmission.

Figure 10:
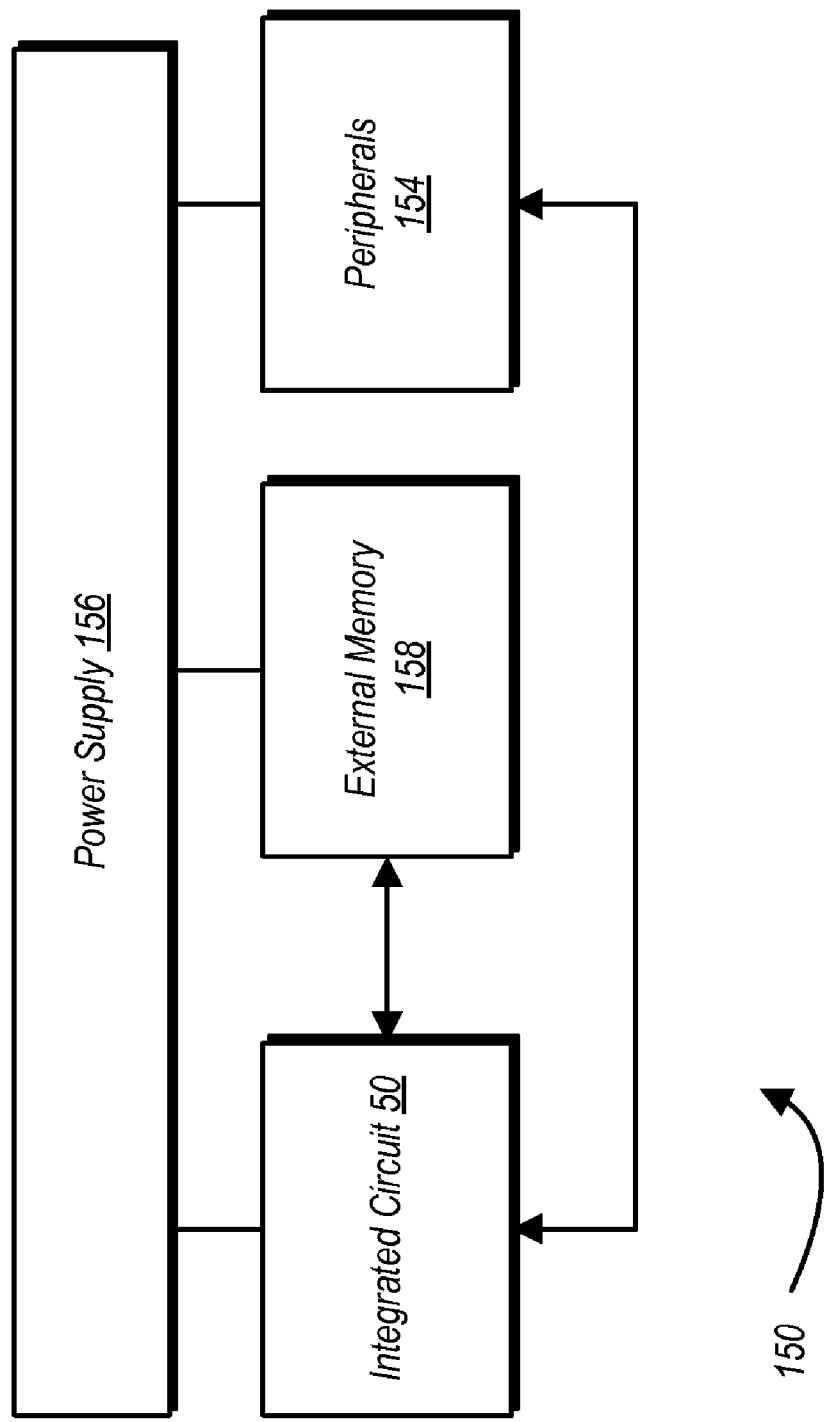
FIG. 10 is a block diagram of one embodiment of a system including the integrated circuit shown in FIG. 1.

Exemplary System:

Turning next to FIG. 10, a block diagram of one embodiment of a system 150 is shown. In the illustrated embodiment, the system 150 includes at least one instance of an IC 50 (from FIG. 5) coupled to one or more peripherals 154 and an external memory 158. A power supply 156 is also provided which supplies the supply voltages to the IC 50 as well as one or more supply voltages to the memory 158 and/or the peripherals 154. Thus, the power supply 156 may include the voltage regulator 18 shown in FIG. 1. In some embodiments, more than one instance of the IC 50 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
    a filter;
    a first inverter having an input coupled to the filter; and
    a half-latch having a second inverter and a feedback circuit,
        wherein the second inverter is coupled in series with the first inverter and wherein the feedback circuit is coupled between an output of the first inverter and an output of the second inverter;
    wherein the feedback circuit includes a feedback transistor having a first terminal coupled to an output of the second inverter and a second terminal coupled to an output of the first inverter, wherein a drive strength of the feedback transistor is greater than a complementary transistor of the first inverter, and wherein the feedback transistor is configured to, when active, drive and maintain the output of the first inverter to a first state regardless of a state on the input of the first inverter.

2. The circuit as recited in claim 1, wherein the first inverter includes a p-channel metal oxide semiconductor (PMOS) transistor, wherein the PMOS transistor is configured to, when active, drive the output of the first inverter high when the feedback circuit is inactive, and wherein the circuit is configured such that the PMOS transistor remains active subsequent to an initial power up sequence.

3. The circuit as recited in claim 2, wherein the feedback transistor is an n-channel metal oxide semiconductor (NMOS) transistor having a gate terminal coupled to the output of the second inverter and a gate terminal, a drain terminal coupled to the output of the first inverter, and a source terminal coupled to a ground node, wherein a drive strength of the NMOS transistor is greater than a drive strength of the PMOS transistor.

4. The circuit as recited in claim 3, wherein the filter is an RC (resistive-capacitive) circuit having a capacitor coupled between a supply voltage node and the input of the first inverter, and a resistor coupled between the input of the first inverter and the ground node.

5. The circuit as recited in claim 4, wherein the circuit is configured to provide a logic 0 on the output of the second inverter if a voltage on the input of the first inverter remains lower than a toggle voltage of the first inverter during the initial power up sequence, and wherein the circuit is configured to provide a logic 1 on the output of the second inverter if the voltage on the input of the first inverter meets or exceeds the toggle voltage of the first inverter during the power up sequence.

6. A circuit comprising:
a first inverter;
a second inverter having an input coupled to an output of the first inverter;
a feedback circuit coupled between an output of the second inverter and the output of the first inverter, wherein the feedback circuit includes an re-channel metal oxide semiconductor (NMOS) transistor having a drive strength greater than a p-channel metal oxide semiconductor (PMOS) transistor of the first inverter; and
a filter having a first node coupled to a supply voltage node, a second node coupled to a ground node, and a third node coupled to an input of the first inverter;
wherein, responsive to power being applied to the supply voltage node during use, a voltage on the third node rises from and subsequently falls to approximately a voltage of the ground node, and wherein, responsive to the voltage on the third node rising to a level sufficient to change a state of the output of the first inverter, the feedback circuit is configured to activate to overdrive a state of the output of the first inverter and further configured to maintain overdriving the state of the output of the output of the first inverter.

7. The circuit as recited in claim 6, wherein the PMOS transistor of the first inverter includes a source terminal coupled to the supply voltage node and a drain terminal coupled to output of the first inverter, wherein the PMOS transistor is configured to remain activated subsequent to the voltage on the third node falling.

8. The circuit as recited in claim 6, wherein the output of the second inverter is configured to output a logic 1 responsive to the voltage on the third node rising to a level sufficient to change a state of the output of the first inverter.

9. The circuit as recited in claim 6, wherein the first inverter is configured to output a logic 1 responsive to the voltage on the third node failing to rise to a level sufficient to change a state of the output of the first inverter subsequent to applying power to the supply voltage node.

10. The circuit as recited in claim 6, wherein, responsive to the voltage on the third node rising to a level sufficient to change a state of the output of the first inverter, the second inverter is configured to output a logic 1, wherein the NMOS transistor of the feedback circuit is configured to activate responsive to the second inverter outputting a logic 1, wherein the NMOS transistor, when activated, provides a pull down path between the output of the first inverter and the ground node.

11. A method comprising:
initially applying a supply voltage to an electronic circuit;
providing an input voltage to an input of a first inverter responsive to applying the supply voltage, wherein the input voltage rises and subsequently falls;
responsive to the input voltage rising to at least a first level:
changing a state of an output of the first inverter from a first state to a second state;
changing a state of an output of a second inverter responsive to changing the state of the output of the first inverter;
activating a feedback transistor responsive to changing the state of the output of the second inverter;
driving the output of the first inverter back to the first state responsive to activating the feedback transistor; and
maintaining the output of the first inverter at the first state, wherein maintaining the output state comprises the feedback transistor overdriving a transistor of the first inverter, wherein the feedback transistor has a greater drive strength than the transistor of the first inverter.

12. The method as recited in claim 11 further comprising, responsive to the input voltage failing to rise to the first level:
maintaining the state of the output of the first inverter at the first state; and
maintaining the state of the output of the second inverter at the second state.

13. The method as recited in claim 11, further comprising maintaining the output of the first inverter at a logic 0 even if an input of the first inverter is a logic 0.

14. The method as recited in claim 13, wherein the transistor of the first inverter is a p-channel metal oxide semiconductor (PMOS) transistor, and wherein the method further comprises maintaining the transistor of the first inverter in an active state subsequent to the input voltage falling, and further comprising the PMOS transistor driving a logic 1 on the output of the first inverter when the feedback transistor is inactive.

15. The method as recited in claim 14, wherein the feedback transistor is an n-channel metal oxide semiconductor (NMOS) having a gate terminal coupled to an output of the second inverter, a drain terminal coupled to the output of the first inverter and the input of the second inverter, and a source coupled to a ground node, wherein the method further comprises:
driving the output of the first inverter to a logic 0 responsive to the input voltage rising to at least the first level;
driving the output of the second inverter to a logic 1 responsive to driving the output of the first inverter to a logic 0;
activating the feedback transistor responsive to driving the output of the second inverter to a logic 1;
driving the output of the first inverter to a logic 0, irrespective of a state of the transistor of the first inverter, responsive to activating the feedback transistor.

16. An integrated circuit comprising:
a plurality of aging detection circuits, wherein each of the aging detection circuits is configured provide an indication of aging, wherein at least one of the aging detection circuits includes:
a filter;
a first inverter having an input coupled to the filter; and a half-latch having a second inverter and a feedback transistor, wherein the second inverter is coupled in series with the first inverter and wherein the feedback transistor includes a gate terminal coupled to an output of the second inverter and a drain terminal coupled to an output of the first inverter;

wherein the feedback transistor is configured to, when active, drive the output of the first inverter to a first state; and a storage unit configured to receive and store indications of aging from each of the plurality of aging circuits;

wherein the integrated circuit is configured to determine an operating voltage based on reading the indications of aging.

17. The integrated circuit as recited in claim 16, wherein the first state is a logic 0 and wherein a second state is a logic 1, and wherein the feedback transistor is configured to, when active, drive the output of the first inverter to a logic 0 even if the input to the first inverter is a logic 0.

18. The integrated circuit as recited in claim 17, wherein the feedback transistor is an n-channel metal oxide semiconductor (NMOS) transistor, wherein the first inverter includes a p-channel metal oxide semiconductor (PMOS) transistor having a gate terminal coupled to the input of the first inverter, a drain terminal coupled to the output of the first inverter, and a source terminal coupled to a supply voltage node, wherein the PMOS transistor is configured to, when active, provide a pull-up path between the output of the first inverter and the supply voltage node.

19. The integrated circuit as recited in claim 18, wherein the NMOS transistor is configured to, when active, provide a pull-down path between the output of the first inverter and a ground node, and wherein the PMOS and NMOS transistors are sized such that when the PMOS and NMOS transistors are concurrently active, the drive strength of the NMOS transistor causes the output node of the first transistor to be pulled down toward ground, and wherein the at least one aging circuit is configured such that the PMOS transistor remains active subsequent to an initial power up sequence.

20. The integrated circuit as recited in claim 16, further comprising a controller configured to determine a required operating voltage for the integrated circuit based on the reading the indications of aging, and further configured to cause the operating voltage to be changed if the required operating voltage for the integrated circuit is not equivalent to a current operating voltage.

21. A circuit comprising:
a filter coupled between a voltage supply node and a ground node;
a first inverter comprising first and second transistors, wherein an input of the first inverter is coupled to the filter at a first node, and wherein the first transistor is configured to, when active, provide a pull-up path between a second node and the voltage supply node;
a half-latch circuit comprising a second inverter and a third transistor, wherein an input of the second inverter is coupled to the second node, wherein the second inverter is configured to provide an output on a third node, wherein a gate terminal of the third transistor is coupled to the third node;
wherein the third transistor is configured to, when active, provide a pull-down path between the second node and the ground node; and
wherein the first and third transistors are sized such that the drive strength of the third transistor exceeds that of the first transistor and such that the second node is pulled down to ground when both the first and third transistors are active.

22. The circuit as recited in claim 21, wherein the first transistor is configured to remain active subsequent to an initial power up sequence.

23. The circuit as recited in claim 21, wherein the third transistor is configured to, once activated, remain active when power is provided to the circuit.

24. The circuit as recited in claim 21, wherein the third transistor is configured to, when active, drive the second node to a logic 0 even if the first node is also at a logic 0.

25. The circuit as recited in claim 21, wherein the filter is a high pass filter including a capacitor coupled between the voltage supply node and the first node and a resistor coupled between the first node and the ground node.

* * * * *

UNITED STATES PATENT AND TRADEMARK OFFICE
CERTIFICATE OF CORRECTION

PATENT NO. : 8,299,825 B2
APPLICATION NO. : 12/610142
DATED : October 30, 2012
INVENTOR(S) : Date Jan Willem Noorlag and Michael Frank It is certified that error appears in the above-identified patent and that said Letters Patent is hereby corrected as shown below:

Claim 6, column 13, line 32, please delete "re-channel" and substitute "n-channel".

Signed and Sealed this
Fifteenth Day of January, 2013

David J. Kappos
*Director of the United States Patent and Trademark Office*